United States Patent
Hokazono (10) Patent No.: US 8,004,050 B2
(45) Date of Patent: *Aug. 23, 2011

(54) SEMICONDUCTOR DEVICE COMPRISING GATE ELECTRODE HAVING ARSENIC AND PHOSPHOROUS

(75) Inventor: Akira Hokazono, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/763,870

(22) Filed: Apr. 20, 2010

(65) Prior Publication Data

US 2010/0200935 A1  Aug. 12, 2010

Related U.S. Application Data

(63) Continuation of application No. 11/333,532, filed on Jan. 18, 2006, now Pat. No. 7,714,364.

(30) Foreign Application Priority Data

Jan. 19, 2005 (JP) ................... 2005-011047

(51) Int. Cl.
*H01L 21/70* (2006.01)
(52) U.S. Cl. .. 257/407; 257/327; 257/408; 257/E29.266
(58) Field of Classification Search .......... 257/327, 257/E29.266, 407, 408
See application file for complete search history.

(56) References Cited

U.S. PATENT DOCUMENTS

| | | | |
|---|---|---|---|
| 3,868,721 A | 2/1975 | Davidsohn | |
| 4,454,523 A * | 6/1984 | Hill | 257/264 |
| 4,485,392 A | 11/1984 | Singer | |
| 5,170,242 A | 12/1992 | Stevens et al. | |
| 5,447,875 A | 9/1995 | Moslehi | |
| 6,017,784 A * | 1/2000 | Ohta et al. | 438/197 |
| 6,235,568 B1 | 5/2001 | Murthy et al. | |
| 6,319,798 B1 | 11/2001 | Yu | |
| 6,329,225 B1 | 12/2001 | Rodder | |

(Continued)

FOREIGN PATENT DOCUMENTS

JP  04-230039 A  8/1992

(Continued)

OTHER PUBLICATIONS

T. Ohguro et al., "Analysis of Anomalously Large Junction Leakage Current of Nickel Silicided N-Type Diffused Layer and its Improvement," Extended Abstracts of the 1993 International Conference on Solid State Devices and Materials, 1993, pp. 192-194.

(Continued)

*Primary Examiner* — Bradley K Smith
*Assistant Examiner* — Mohammad T Karimy
(74) *Attorney, Agent, or Firm* — Foley & Lardner LLP (57) ABSTRACT

A semiconductor device is disclosed, which comprises a gate electrode having a laminated structure of a polycrystalline silicon film or a polycrystalline germanium film containing arsenic and a first nickel silicide layer formed in sequence on an element forming region of a semiconductor substrate through a gate insulating film, a sidewall insulating film formed on a side surface of the gate electrode, source/drain layers containing arsenic formed in the element forming region at both side portions of the gate electrode, and second nickel silicide layers formed on the source/drain layers, wherein a peak concentration of arsenic contained in the gate electrode is at least $\frac{1}{10}$ of a peak concentration of arsenic contained in the source/drain layers.

19 Claims, 6 Drawing Sheets

U.S. PATENT DOCUMENTS

| | | |
|---|---|---|
| 6,781,207 B2 | 8/2004 | Kumeno |
| 7,221,009 B2 | 5/2007 | Saiki |
| 2001/0030349 A1 | 10/2001 | Lin et al. |
| 2005/0040479 A1* | 2/2005 | Koldiaev et al. ............... 257/411 |

FOREIGN PATENT DOCUMENTS

| | | |
|---|---|---|
| JP | 07-135317 A | 5/1995 |
| JP | 07-263684 A | 10/1995 |
| JP | 10-340962 A | 12/1998 |
| JP | 11-097684 A | 4/1999 |
| JP | 11-220123 A | 8/1999 |
| JP | 2000-114395 A | 4/2000 |
| TW | 561510 B | 11/2003 |
| TW | 577146 B | 2/2004 |

OTHER PUBLICATIONS

A. Hokazono, U.S. PTO Notice of Allowance and Allowability, U.S. Appl. No. 11/333,532, dated Dec. 29, 2009.

A. Hokazono, U.S. PTO Final Office Action, U.S. Appl. No. 11/333,532, dated Aug. 5, 2009.

A. Hokazono, U.S. PTO Final Office Action, U.S. Appl. No. 11/333,532, dated May 21, 2009.

A. Hokazono, U.S. PTO Office Action, U.S. Appl. No. 11/333,532, dated Oct. 23, 2008.

A. Hokazono, U.S. PTO Advisory Action, U.S. Appl. No. 11/333,532, dated Jul. 28, 2008.

A. Hokazono, U.S PTO Final Office Action, U.S. Appl. No. 11/333,532, dated Apr. 15, 2008.

A. Hokazono, U.S. PTO Office Action, U.S. Appl. No. 11/333,532, dated Oct. 18, 2007.

* cited by examiner

SEMICONDUCTOR DEVICE COMPRISING GATE ELECTRODE HAVING ARSENIC AND PHOSPHOROUS

CROSS-REFERENCE TO RELATED APPLICATIONS

This application is a Continuation application of U.S. application Ser. No. 11/333,532, filed Jan. 18, 2006 which is based upon and claims the benefit of priority from prior Japanese Patent Application No. 2005-011047, filed Jan. 19, 2005, the entire contents of which are incorporated herein by reference.

BACKGROUND OF THE INVENTION

1. Field of the Invention

This invention relates to a semiconductor device and a method of manufacturing the same.

2. Description of the Related Art

Recently, with the high integration of semiconductor devices, MOSFETs (Metal oxide Semiconductor Field Effect Transistors) constituting a semiconductor device also have been miniaturized. This miniaturization reduces width of the wirings and also reduces depths of source/drain diffusion layers, thereby increasing electric resistances of the wirings and the diffusion layers etc., which increases a delay of signal transmission. In order to prevent such electric resistances from increasing, it is required for an impurity concentration distribution curve in a high concentration diffusion region to represent steep inclines with respect to both a longitudinal direction and a lateral direction. Further, there is employed a method of forming a low resistance silicide on a gate electrode or a diffusion layer in a self-aligning manner.

In an nMOSFET (n-channel Metal oxide Semiconductor Field Effect Transistors), high concentration diffusion region having an impurity concentration distribution curve representing steep inclines is attained by employing arsenic as impurity. However, when forming silicide, there are some problems. That is, it is reported that forming silicide on a silicon substrate highly doped with an impurity, in particular, arsenic, allows an irregular silicide layer to form. Refer to, for example, T. Ohguro, T. Morimoto, Y. Ushiku, and H. Iwai "Analysis of Anomalously Large Junction Leakage Current of Nickel Silicided N-Type Diffused Layer and Its Improvement" Extended Abstract of the 1993 International Conference on Solid State Devices and Materials, 1993, pp. 192-194.

For example, when employing arsenic as an impurity to be doped and forming a nickel silicide layer as a silicide layer to be formed, nickel is deposited on a silicon substrate containing arsenic, followed by siliciding the deposited nickel by the use of heat treatment. In this case, however, the silicide layer formed on the silicon substrate unfavorably becomes an irregular silicide layer composed of not only nickel silicide, but also a compound containing nickel, silicon, oxygen, and arsenic.

In a conventional CMOS process, there is simultaneously carried out an impurity doping into a semiconductor substrate for forming a highly doped diffusion layer and an impurity doping into the gate electrode. For this reason, arsenic is doped into the gate electrode by the same amount as that into the highly doped diffusion layer. Therefore, forming a nickel silicide layer on the gate electrode causes an irregular silicide layer to be unfavorably formed. This silicidation may not only cause the silicide layer on the gate electrode to be formed thicker than the silicide layer on the silicon substrate, but also cause the entire of the gate electrode to be silicided. Carrying out the doping into the gate electrode in synchronization with the doping into the semiconductor substrate for forming the highly doped diffusion layer provides a problem that the gate electrode is not subjected to ion-implantation at the most suitable concentration.

Excessively siliciding the gate electrode causes the sheet resistance of the silicide layer to be varied. Further, this excessive silicidation of the gate electrode may reach the entire of the gate electrode, thereby causing the silicided gate electrode to contact the gate insulating film to thereby change the work function of the gate electrode, which causes the threshold voltage to be unfavorably shifted or varied. This remarkably reduces the reliability of the semiconductor device.

BRIEF SUMMARY OF THE INVENTION

According to an aspect of the present invention, there is provided a semiconductor device comprising:

a gate electrode having a laminated structure of a polycrystalline silicon film or a polycrystalline germanium film containing arsenic and a first nickel silicide layer formed in sequence on an element forming region of a semiconductor substrate through a gate insulating film;

a sidewall insulating film formed on a side surface of the gate electrode;

source/drain layers containing arsenic formed in the element forming region at both side portions of the gate electrode; and second nickel silicide layers formed on the source/drain layers, wherein a peak concentration of arsenic contained in the gate electrode is at least $\frac{1}{10}$ of a peak concentration of arsenic contained in the source/drain layers.

According to another aspect of the present invention, there is provided a method of manufacturing a semiconductor device, comprising:

depositing a first insulating film, and a polycrystalline silicon film or a polycrystalline silicon germanium film on a surface of a semiconductor substrate in sequence;

implanting impurity ion into the polycrystalline silicon film;

depositing a second insulating film on the polycrystalline silicon film;

etching the first insulating film, the polycrystalline silicon film and the second insulating film to form a gate insulating film made of the first insulating film, a gate electrode made of the polycrystalline silicon film, and a cap film made of the second insulating film;

implanting arsenic ion into the semiconductor substrate with the cap film as a mask to form a first source/drain layer;

depositing at least one layer of insulating films over the surface of the semiconductor substrate;

anisotropic-etching the at least one layer of the insulating films to form a sidewall insulating film on a side surface of the gate electrode;

implanting arsenic ion into the semiconductor substrate with the sidewall insulating films and the cap film as a mask to form a second source/a drain layer;

removing the cap film; and depositing nickel on the gate electrode, the second source/drain layer, and subjecting the deposited nickel to heat treatment to form a nickel silicide layer on the gate electrode and the second source/drain layer, wherein a peak concentration of arsenic contained in the gate electrode is at least 1/10 of a peak concentration of arsenic contained in the second source/drain layer.

DETAILED DESCRIPTION OF THE INVENTION

Embodiments of the present invention will now be described in detail with reference to the accompanying drawings.

First Embodiment

Figure 1:
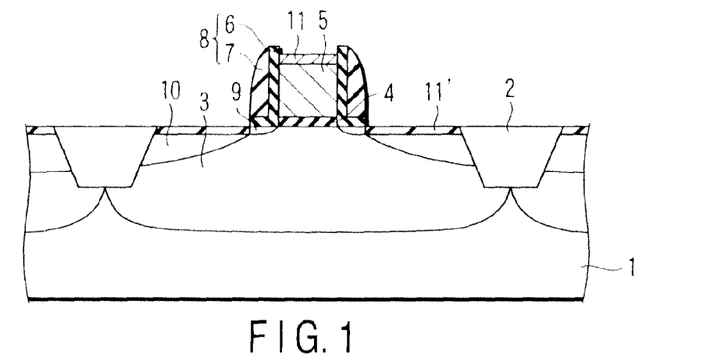
FIG. 1 is a sectional view of a semiconductor device according to a first embodiment of the present invention.

FIG. 1 is a sectional view of a semiconductor device according to a first embodiment of the present invention.

A semiconductor device according to this embodiment includes an element separation region 2 composed of an insulating film formed in the semiconductor substrate 1, and a well region 3 formed in an element forming region surrounded by the element separation region 2. A polycrystalline silicon film as a gate electrode 5 is formed on the well region 3 for the element forming region through a gate insulating film 4 of a silicon dioxide film. In the gate electrode 5, impurities suitable for the operation of a MOS transistor are implanted. Further, on both side surfaces of the gate electrode 5, sidewall insulating films 8 including a silicon nitride film 6 and a silicon dioxide film 7 are formed. The sidewall insulating film 8 includes two films of the silicon nitride film 6 and the silicon dioxide film 7, however, it may include only the silicon dioxide film 7. Moreover, on both side portions of the well region 3 below the gate electrode 5 are formed a shallow source/drain diffusion region 9 into which arsenic is ion-implanted as impurities, and a deep source/drain diffusion region 10 into which arsenic is ion-implanted as an impurity. The shallow source/drain diffusion region 9 is formed beneath the side wall insulating film 8, and the deep source/drain diffusion region 10 is formed outside the shallow source/drain diffusion region 9 and extends up to the element separation region 2. Also, nickel silicide layers 11, 11' are formed on the gate electrode 5 and the deep source/drain diffusion region 10.

Figure 2:
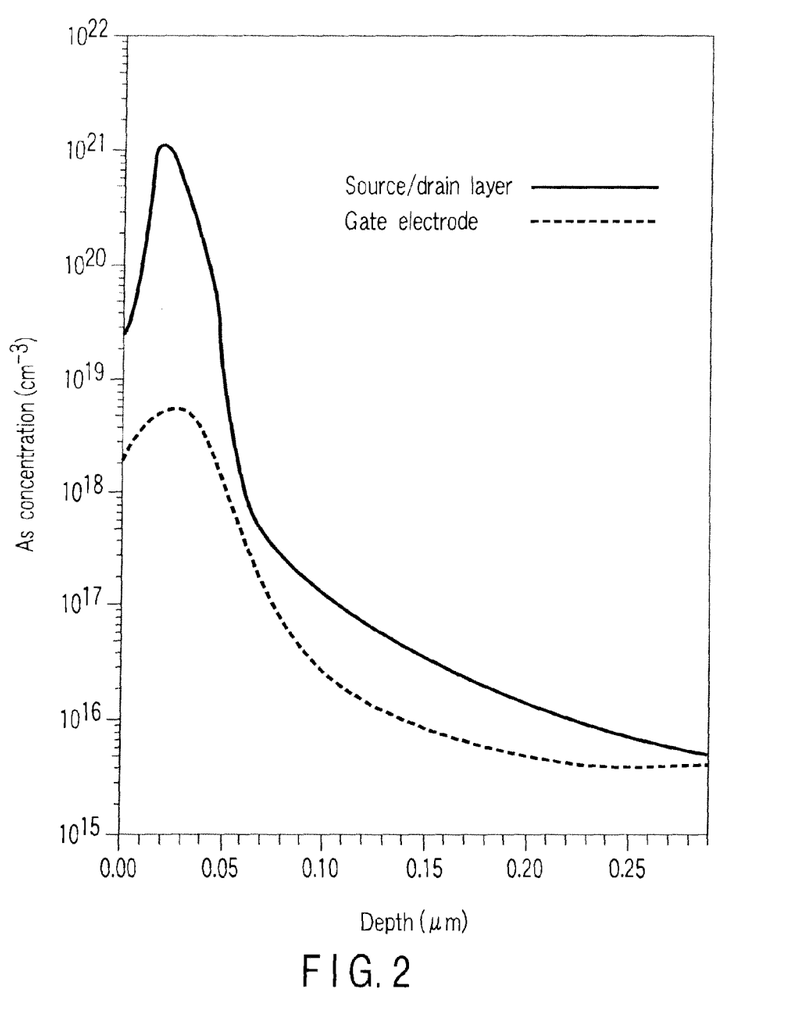
FIG. 2 is a graph showing arsenic concentration distribution characteristic curves of a gate electrode and a deep source/drain diffusion layer in the semiconductor device according to the first embodiment of the present invention.

FIG. 2 shows an arsenic concentration distribution curve in the gate electrode 5 (represented by a broken line) and an arsenic concentration distribution curve in the deep source/drain diffusion region 10 (represented by a full line) in the first embodiment of the present invention. In the figure, the ordinate axis represents the concentration of arsenic contained in the gate electrode 5 or the deep source/drain diffusion region 10, and the abscissa axis represents a depth from the gate electrode 5 or the deep source/drain diffusion region 10. In FIG. 2, a peak value of the concentration distribution curve of the gate electrode 5 or the deep source/drain diffusion region 10 is referred to as a peak concentration. The peak concentration of arsenic contained in the gate electrode 5 is less than that of arsenic contained in the deep source/drain diffusion region 10. The peak concentration of arsenic contained in the gate electrode 5 is 1E19 cm$^{-3}$ or less. In this peak concentration, a dose amount out of ion-implantation conditions is around 1E13 cm$^{-2}$, thereby providing hardly any irregular silicide layer composed of a compound of nickel, silicon, oxygen, and arsenic. In the gate electrode 5, other impurities such as phosphorus which are suitable for the operation of the MOS transistor are implanted. The peak concentration of arsenic contained in the deep source/drain diffusion region 10 is 1E20 cm$^{-3}$ or more. This peak concentration is realized by ion-implantation for forming the shallow source/drain diffusion region 9 and additional ion-implantation for forming the deep source/drain diffusion region 10. Moreover, the gate insulating film 4 is made of a silicon dioxide film in this embodiment, however, it may be made of a high dielectric constant film such as SiON or SiN. Also, the gate electrode 5 is made of a polycrystalline silicon film, however, it may be made of a polycrystalline silicon germanium film.

According to the above-mentioned construction, the peak concentration of arsenic contained in the gate electrode 5 is far less than that of arsenic contained in the deep source/drain diffusion region 10, and further impurities such as phosphorus are ion-implanted into the gate electrode 5 by an optimal amount. Therefore, the nickel silicide on the gate electrode 5 becomes normal nickel silicide composed of only nickel silicide, however, does not become an irregular silicide layer composed of a compound containing nickel, silicon, oxygen, and arsenic, which improves the reliability of the semiconductor device.

Now, processes of manufacturing the semiconductor device in this embodiment will be explained. FIGS. 3 to 7 are sectional views of the semiconductor device in the manufacturing processes.

Figure 3:
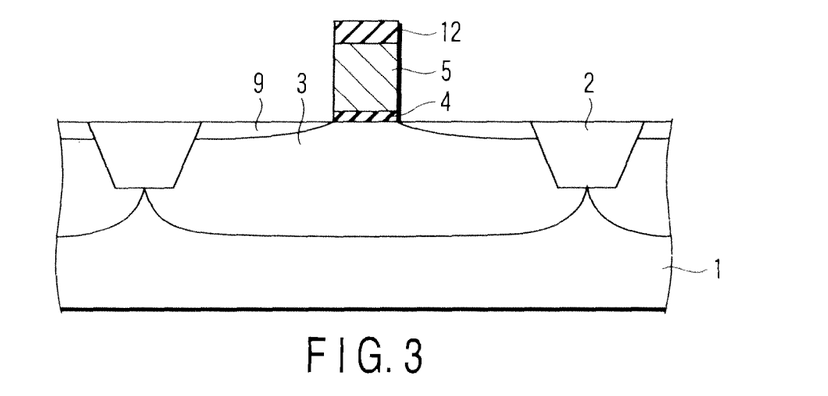
FIG. 3 is a sectional view of the semiconductor device according to the first embodiment of the present invention, showing one of the processes of a method of manufacturing the semiconductor device.

Firstly, as shown in FIG. 3, on the semiconductor substrate 1 is formed an element separation region 2 made of an insulating film embedded in a groove having a depth of 200 to 350 nm by the use of an STI (Shallow Trench Isolation) method or LOCOS (Local Oxidation of Silicon) method. Secondly, a dioxide film having a film thickness of not greater than 20 nm is formed on a surface of the semiconductor substrate at an element forming region surrounded by the element separation region 2, followed by carrying out ion-implantation and an RTA (Rapid Thermal Annealing) in order to form a well region 3 and a channel region. In this embodiment, the well region 3 forms a p-type well region since this embodiment intends to ion-implant arsenic into a diffusion layer to be formed, that is, to form an nMOSFET. Therefore, the well region 3 is subjected to boron ion-implantation, provided that its accelerating voltage is 260 KeV and its dose amount is 2.0E13 cm$^{-2}$, and the channel region is subjected to its arsenic ion-implantation, provided that its accelerating voltage is 100 KeV, and its dose amount is 1.5E13 cm$^{-2}$.

Next, by the use of a thermal oxidation method, a CVD (Chemical Vapor Deposition) method, etc., a silicon dioxide film for a gate insulating film 4 is deposited by 0.5 to 6.0 nm in film thickness, and then, a polycrystalline silicon film for a gate electrode 5 is deposited by 50 to 200 nm in film thickness. Thereafter, phosphorus is ion-implanted into the polycrystalline silicon film 5, provided that its accelerating voltage is 5 to 10 KeV and its dose amount is 3.0 to 5.0E15 cm$^{-2}$, in such a manner that the gate electrode 5 is sufficiently suppressed in depletion.

Then, by the use of a thermal oxidation method, a CVD method, etc., a silicon nitride film 12 is deposited on the polycrystalline silicon film 5 by 50 to 100 nm in film thickness, and then, the silicon nitride film 12 is subjected to patterning for forming a gate of 5 to 150 nm in wiring width, by the use of an optical lithography, an X-ray lithography method, an electronic beam lithography method, etc. In the patterning, etching the silicon nitride film 12 and the polycrystalline silicon film 5 by the use of an RIE (Reactive Ion Etching) method causes the gate electrode 5 and the cap film 12 on the gate electrode 5 to be formed.

The gate insulating film 4 is made of a silicon dioxide film in this embodiment, however, it may be made of a high dielectric constant film such as SiON and SiN, etc. Further, the gate electrode 5 is made of a polycrystalline silicon film, however, it may be made of a polycrystalline silicon germanium film.

Next, a silicon dioxide film is formed on the semiconductor substrate as a post-oxide film by 0.5 to 6.0 nm in film thickness by the use of a thermal oxidation method. Then, arsenic, with the cap film 12 and gate electrode 5 as a mask, is ion-implanted into an element forming region, provided that its accelerating voltage is 1.0 to 5.0 KeV and its dose amount is 5.0E14 cm$^{-2}$ to 1.5E15 cm$^{-2}$. Thereafter, activating the ion-implanted arsenic by the use of an RTA method causes a shallow source/drain diffusion layer 9 having a depth of 10 to 20 nm. In some cases, the shallow source/drain diffused layer 9 may be formed by forming offset spacers at both side surfaces of the gate electrode 5, and then ion-implanting arsenic into the element forming region and performing the activation by a TDRTA method.

Figure 4:
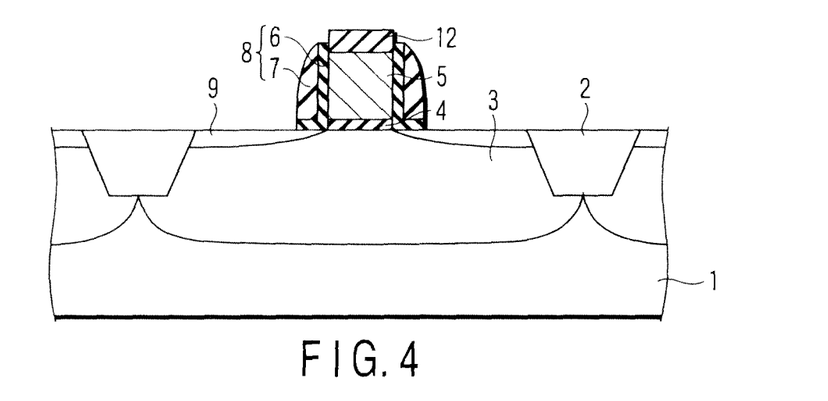
FIG. 4 is a sectional view of the semiconductor device according to the first embodiment of the present invention, showing one of the processes of the method of manufacturing the semiconductor device, following the manufacturing process shown in FIG. 3.

As shown in FIG. 4, sidewall insulating films 8 are formed on both side surfaces of the gate electrode 5 by depositing a silicon nitride film 6 and a silicon dioxide film 7 by the use of a CVD method in sequence on the semiconductor substrate 1, and then etching-back the silicon oxide film 7 and the silicon nitride film 6 by the use of an RIE method. The silicon nitride film 6 and the silicon oxide film 7 may be superposed inversely by first depositing the silicon dioxide film 7 on the semiconductor substrate 1 and then forming the silicon nitride film 6 on the silicon dioxide film 7. Moreover, the sidewall insulating film 8 may be formed by only the silicon dioxide film 7 without forming the silicon nitride film 6.

Figure 5:
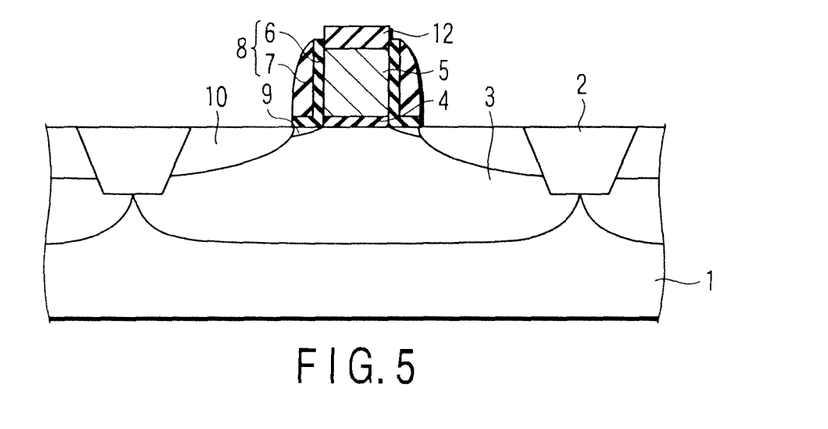
FIG. 5 is a sectional view of the semiconductor device according to the first embodiment of the present invention, showing one of the processes of the method of manufacturing the semiconductor device, following the manufacturing process shown in FIG. 4.

As shown in FIG. 5, a deep source/drain diffusion layer 10 having a depth of 40 to 100 nm is formed with the gate electrode 5 and sidewall insulating film 8 as a mask by ion-implanting arsenic, provided that its accelerating voltage is 5 to 40 KeV and its dose amount is 1.0E15 to 4.0E15 cm$^{-2}$. Simultaneously, phosphorus is ion-implanted into the element forming region, provided that its accelerating voltage is 5 to 20 KeV and its dose amount 1.0E15 to 4.0E15 cm$^{-2}$. Then, the ion-implanted arsenic and phosphorus are activated by the use of an RTA method. Here, reference to the concentration distribution (represented by broken line) for arsenic in the gate electrode 5 and the concentration distribution (represented by a full line) for arsenic in the deep source/drain diffusion region 10 in the semiconductor device of this embodiment in FIG. 2 shows that the arsenic concentration characteristic curve of the deep source/drain diffusion layer 10 represents a steep profile because the deep source/drain diffusion layer 10 contains arsenic, which suppresses an interface resistance between nickel silicide and n+ silicon. Since the cap film 12 is formed on the gate electrode 5 in this embodiment, the arsenic ion-implantation into the gate electrode 5 is suppressed. This lowers the peak concentration of arsenic in the gate electrode 5 down to 1E19 cm$^{-3}$ or less, which means that the gate electrode 5 is not influenced by arsenic. Meanwhile, the peak concentration of arsenic in the deep source/drain diffusion layer 10 reaches 1E20 cm$^{-3}$ or more, because the ion-implantation is carried out two times, such as the previous ion-implantation for forming the shallow source/drain diffusion layer 9, and this ion-implantation for the deep source/drain diffusion region 10, in order to form the deep source/drain diffusion region 10.

Figure 6:
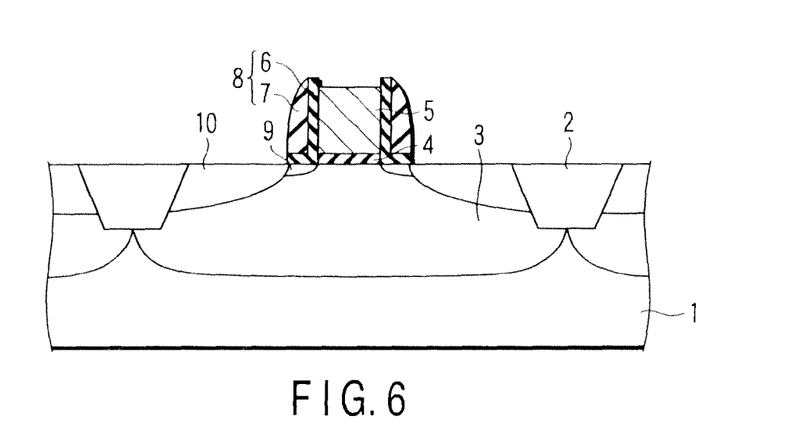
FIG. 6 is a sectional view of the semiconductor device according to the first embodiment of the present invention, showing one of the processes of the method of manufacturing the semiconductor device, following the manufacturing process shown in FIG. 5.

As shown in FIG. 6, the cap film 12 is removed from above the gate electrode 5 by wet etching using phosphoric acid which is heated up to 150 to 180° C. Otherwise, a silicon layer or a silicon germanium layer may be subjected to selective epitaxial growth on the deep source/drain diffusion layer 10 before removing the cap layer 12 from above the gate electrode 5. Thereby, the deep source/drain diffusion layer 10 is made to be a so-called raised source/drain diffusion layer, which reduces a junction leakage current of the source/drain diffusion layer 10 to thereby reduce a contact resistance.

Figure 7:
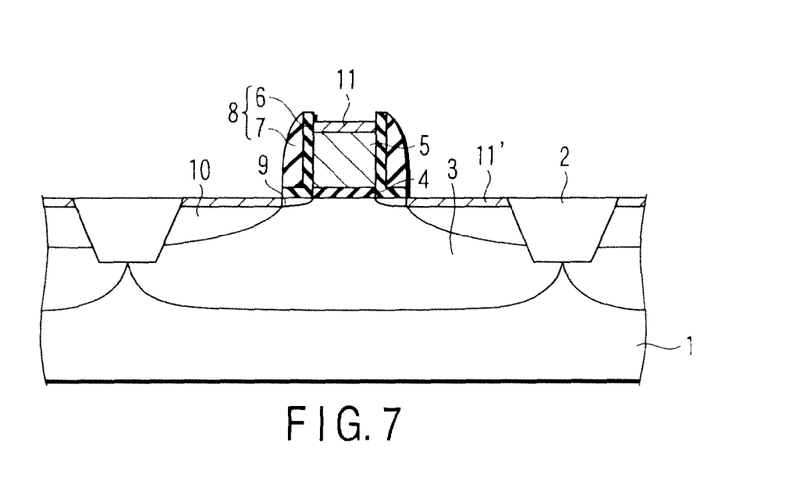
FIG. 7 is a sectional view of the semiconductor device according to the first embodiment of the present invention, showing one of the processes of the method of manufacturing the semiconductor device, following the manufacturing process shown in FIG. 6.

As shown in FIG. 7, nickel is deposited on the semiconductor substrate 1 by the use of a sputtering method, and then nickel silicide layers 11, 11' are formed on the gate electrode 5 and the deep source/drain diffusion layer 10 by the use of an RTA method at 400 to 500° C. for silicidation. Thereafter, non-silicided nickel is removed by etching using a mixed solution of sulfuric acid and hydrogen peroxide solution.

According to the aforementioned procedures, when forming the deep source/drain diffusion layer 10 by arsenic ion-implantation, the cap film 12 on the gate electrode 5 suppresses arsenic from ion-implanting into the gate electrode 5. This makes it possible to prevent an irregular silicide layer composed of a compound of nickel, silicon, oxygen, and arsenic from being formed on the gate electrode 5. Moreover, a titanium nitride film may be deposited after nickel sputtering. Further, after carrying out low temperature RTA at 250 to 400° C. instead of the RTA at 400 to 500° C., etching using a mixed solution of sulfuric acid and hydrogen peroxide solution, and RTA at 400 to 500° C. may be carried out in sequence in order to lower a sheet resistance, which is referred to as "two step annealing".

Thereafter, a film having an RIE selectivity higher than an interlayer insulating film material is formed on a silicide film. Then, the interlayer insulating film such as TOES, BPSG, and SiN etc. is deposited, and the deposited interlayer dielectric film is subjected to chemical mechanical polishing (CMP) in order to planarize an upper surface of the substrate. Thereafter, a resist pattern used for forming contact holes is formed, and then, the interlayer insulating film is subjected to RIE by using the resist pattern as a mask to thereby form contact holes in the interlayer insulating film. A barrier metal such as titanium and titanium nitride is deposited, followed by subjecting tungsten to selective growth, and then carrying out a CMP process. Finally, a metal film for wiring is deposited, and then, a process including an exposure process for forming wiring is carried out, to thereby form a semiconductor device.

According to this embodiment, the silicon nitride film as the cap film 12 is formed on the gate electrode 5 before forming the deep source/drain diffusion layer 10. Therefore, it is possible to prevent arsenic from being ion-implanted into the gate electrode 5 when ion-implanting arsenic in order to form the deep source/drain diffusion layer 10. For this reason, when forming the nickel silicide layer 11 on the gate electrode 5, the nickel silicide layer 11 is formed as a nickel silicide film comprised of only nickel silicide, not as an irregular silicide film comprised of a compound of nickel, silicon, oxygen, and arsenic, which improves the reliability of the semiconductor device. In addition, arsenic ion-implantation into the gate electrode 5 is suppressed by the cap film 12.

Second Embodiment

Figure 8:
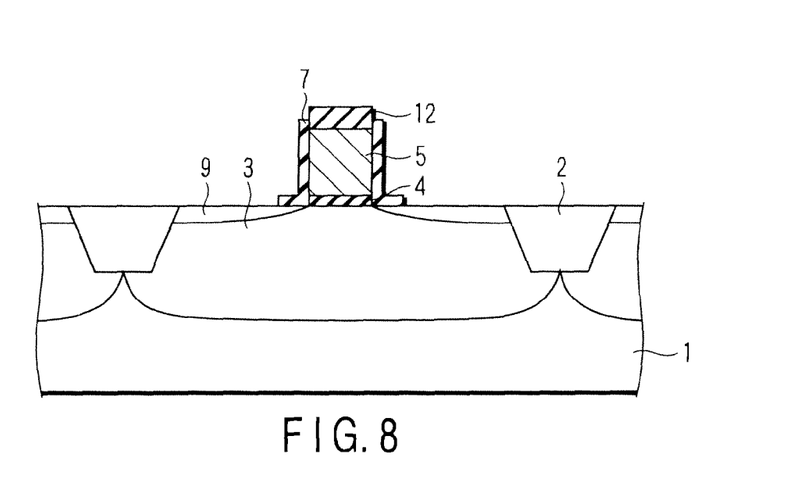
FIG. 8 is a sectional view of the semiconductor device according to a second embodiment of the present invention, showing one of the processes of a method of manufacturing the semiconductor device.
Figure 9:
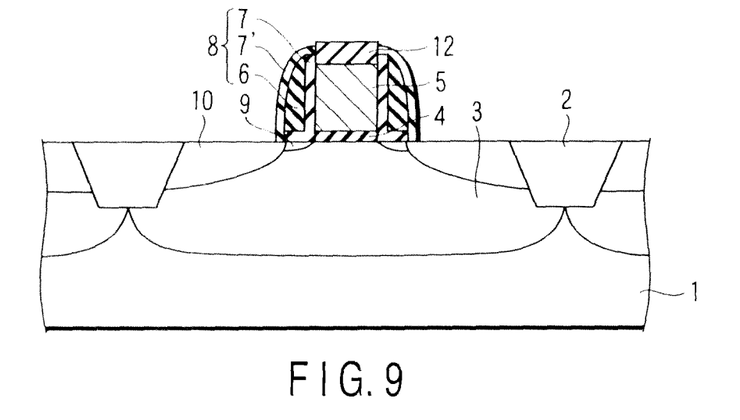
FIG. 9 is a sectional view of the semiconductor device according to the second embodiment of the present invention, showing one of the processes of the method of manufacturing the semiconductor device, following the manufacturing process shown in FIG. 8.
Figure 10:
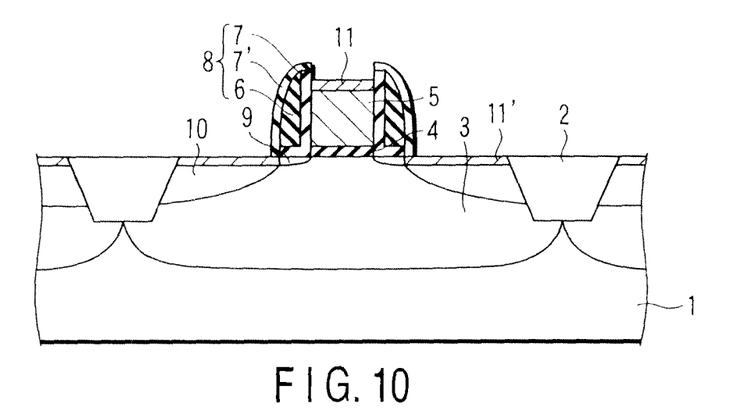
FIG. 10 is a sectional view of the semiconductor device according to the second embodiment of the present invention, showing one of the processes of the method of manufacturing the semiconductor device, following the manufacturing process shown in FIG. 9.

FIGS. 8 to 10 are sectional views of a semiconductor device according to a second embodiment of the present invention, showing manufacturing processes of the semiconductor device. This embodiment is different from the first embodiment, as shown in FIG. 10, in that sidewall insulating films 8 on both side surfaces of the gate electrode 5 are of a three-layer laminated structure type in which a silicon dioxide film 7, a silicon nitride film 6, and a silicon dioxide film 7' are deposited on the both side surfaces of the gate electrode 5 in sequence. Here, the silicon dioxide film 7 may not be provided. That is, the sidewall insulating film 8 may be of a two-layer laminated structure in which the silicon nitride film 6 and the silicon dioxide film 7' are deposited on the both side surfaces of the gate electrode 5 in sequence.

There will be detailed below manufacturing processes according to this embodiment.

There is first formed a device structure of FIG. 3 according to the first embodiment.

Then, a silicon dioxide film 7 is deposited on the semiconductor substrate 1 by the use of a CVD method, followed by depositing a silicon nitride film 6 thereon. Next, the silicon nitride film 6 and the silicon dioxide film 7 are etched back by the use of an RIE method, and sidewall insulating films including the silicon nitride film 6 and the silicon dioxide film 7 are formed on the both side surfaces of the gate electrode 5. The silicon dioxide film 7 may not be provided. That is, only the silicon nitride film 6 may be formed on the both side surfaces of the gate electrode 5.

Next, as shown in FIG. 9 with the gate electrode 5 and the sidewalls of the gate electrode 5 as a mask, arsenic is ion-implanted into the well region 3, provided that its accelerating voltage is 5 to 40 KeV and its dose amount is 1.0E15 to 4.0E15 cm$^{-2}$, simultaneously phosphorus is ion-implanted into the well region 3, provided that its accelerating voltage is 5 to 20 KeV and its dose amount 1.0E15 to 4.0E15 cm$^{-2}$, followed by activating the ion-implanted arsenic by the use of RTA. This enables a deep source/drain diffusion layer 10 of 40 to 100 mm in depth. Since the deep source/drain diffusion layer 10 contains arsenic, the arsenic concentration characteristic curve represents a steep profile, thereby suppressing an interface resistance between nickel silicide and n+ silicon. Since the cap film 12 is formed on the gate electrode 5, the arsenic ion-implantation into the gate electrode 5 is suppressed when ion-implanting arsenic in this process.

Subsequently, a silicon dioxide film is deposited over the surface of the semiconductor substrate 1. Then, etching back the deposited silicon dioxide film causes a silicon dioxide film 7' for covering the silicon nitride film 6 to be formed on the sidewall insulating film including the silicon nitride film 6 and the silicon dioxide film 7. This causes a three-layer structure of the silicon nitride film 6 and the silicon dioxide films 7 and 7' to be formed.

As in the first embodiment, the cap film 12 is removed from above the gate electrode 5 by wet etching using phosphorusic acid which is heated up to 150 to 180° C. as shown in FIG. 10. Otherwise, a silicon layer or a silicon germanium layer may be subjected to selective epitaxial growth on the deep source/drain diffusion layer 12 before removing the cap layer 10 from above the gate electrode 5. This can make the deep source/drain diffusion layer 10 a so-called raised source/drain diffusion layer, so that it is possible to reduce a junction leak current of the source/drain diffusion layer 10 to thereby reduce the contact resistance.

As in the first embodiment, carrying out nickel silicidation causes nickel silicide layers 11 to be formed on the gate electrode 5 and the deep source/drain diffusion layer 10, as shown in FIG. 10.

Also in manufacturing procedures of this embodiment, a silicon nitride film as the cap film 12 is formed on the gate electrode 5 before forming the deep source/drain diffusion layer 10. Therefore, it is possible to suppress arsenic ion-implantation into the gate electrode 5, which provides the same effect as the first embodiment.

Third Embodiment

Figure 11:
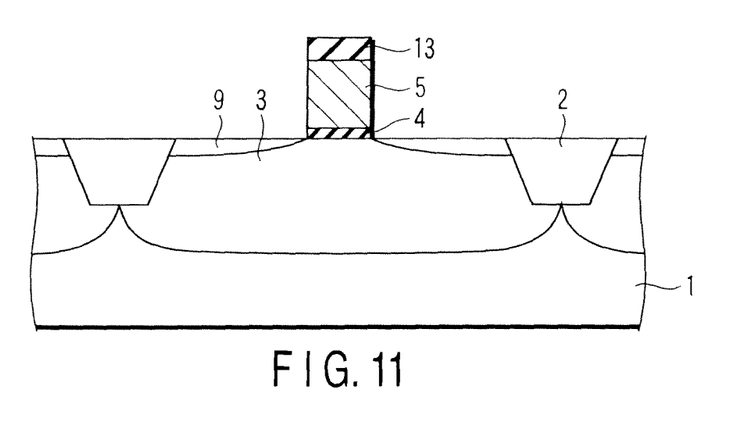
FIG. 11 is a sectional view of the semiconductor device according to a third embodiment of the present invention, showing one of the processes of a method of manufacturing the semiconductor device.
Figure 12:
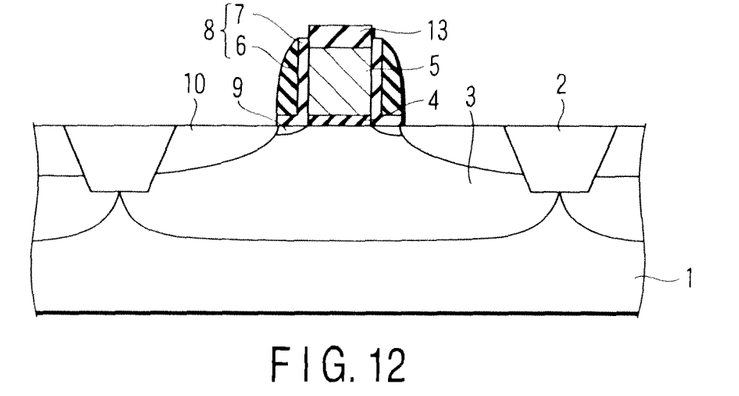
FIG. 12 is a sectional view of the semiconductor device according to the third embodiment of the present invention, showing one of the processes of the method of manufacturing the semiconductor device, following the manufacturing process shown in FIG. 11.
Figure 13:
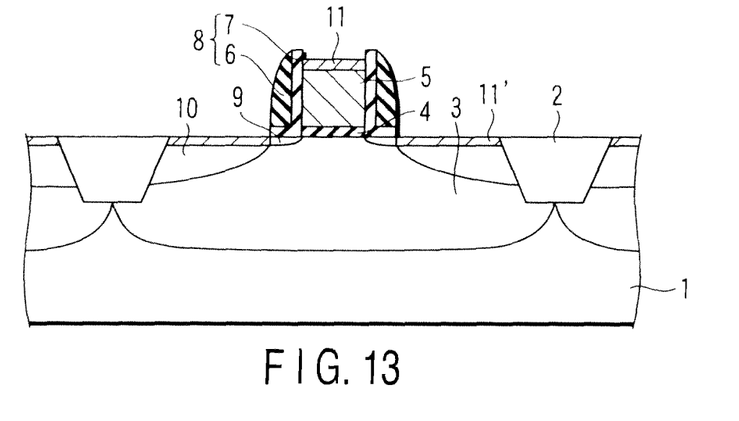
FIG. 13 is a sectional view of the semiconductor device according to the third embodiment of the present invention, showing one of the processes of the method of manufacturing the semiconductor device, following the manufacturing process shown in FIG. 12.

FIGS. 11 to 13 are sectional views of a semiconductor device according to a third embodiment, of the present invention showing a manufacturing method of the semiconductor device.

Firstly, this embodiment is different from the first embodiment in that the cap film above the gate electrode 5 is formed by not a silicon nitride film 12 (FIG. 3), but a silicon dioxide film 13 as shown is FIG. 11. Secondly, this embodiment is different from the first embodiment, as shown in FIG. 13, in that the silicon dioxide film 7 and the silicon nitride film 6 forming the sidewall insulating film 8 on the gate electrode 5 are deposited on the gate electrode 5 in the order. That is, the order in which the silicon dioxide film 7 and the silicon nitride film 6 for forming the sidewall insulating film 8 are deposited is opposite to that of the first embodiment. In this embodiment, the sidewall insulting film 8 includes a two-layer structure of the silicon nitride film 6 and the silicon dioxide film 7, however, the silicon dioxide film 7 may not be provided. That is, the sidewall insulating layer 8 may be formed only by the silicon nitride film 6 formed on the both side surfaces of the gate electrode 5.

There will be detailed below manufacturing processes according to this embodiment. As described above, this embodiment is different from the first embodiment in that the cap film 12 above the gate electrode 5 material is formed by not a silicon nitride film 12 (FIG. 3), but a silicon dioxide film 13 as shown in FIG. 11. That is, in the manufacturing processes of this embodiment, before the device structure of FIG. 11 is formed, the silicon dioxide film 13 having a thickness of 500 to 1000 Å, instead of the silicon nitride film 12, is deposited on the gate electrode 5 deposited as shown in FIG. 3, as in the first embodiment. Thereafter, the gate electrode 5 is processed, and then post-oxidation for forming the silicon dioxide film on the semiconductor substrate is carried out. In some cases, the shallow source/drain diffusion layer 9 having a depth of 10 to 20 nm may be formed by forming offset spacers on side surfaces of the gate electrode 5, and then ion-implanting arsenic into the element forming region, provided that its accelerating voltage is 1.0 to 5.0 KeV and its dose amount is 5.0E14 cm$^{-2}$ to 1.5E15 cm$^{-2}$ followed by activating the ion-implanted arsenic by the use of a TDRTA method. In some cases, the shallow source/drain diffusion layer 9 may be formed by forming offset spacers on the side surfaces of the gate electrode 5, and then ion-implanting arsenic into the element forming region, followed by activating the ion-implanted arsenic by the use of a TDRTA method.

Next, a silicon dioxide film 6 and a silicon nitride film 7 are deposited over the surface of the semiconductor substrate by the use of a CVD method. Then, the silicon nitride film 7 and the silicon dioxide film 6 are etched back by the use of an RIE method, which causes a sidewall insulating film 8 composed of the silicon dioxide film 6 and the silicon nitride film 7 to be formed on both side surfaces of the gate electrode 5. Moreover, sidewalls of the gate electrode 5 may be formed by only the silicon dioxide film 7 without depositing the silicon dioxide film 6.

Next, as shown in FIG. 12, arsenic is ion-implanted provided that its accelerating voltage is 5 to 40 KeV, and its dose amount is 1.0E15 to 4.0E15 cm$^{-2}$, and simultaneously, phosphorus is ion-implanted, provided that its accelerating voltage is 5 to 20 KeV and its dose amount is 1.0E15 to 4.0E15 cm$^{-2}$, into the semiconductor substrate 1 with gate electrode and sidewall insulating film 8 as a mask. Then, by activating the ion-implanted arsenic and phosphorus by the use of RTA, a deep source/drain diffusion layer 10 having a depth of 40 to 100 nm is formed. Since the deep source/drain diffusion layer 10 contains arsenic, the arsenic concentration characteristic curve represents a steep profile, thereby suppressing an interface resistance between nickel silicide and n+silicon. Since the cap film 13 is formed on the gate electrode 5, the arsenic ion-implantation into the gate electrode 5 is suppressed in this process.

Subsequently, as shown in FIG. 13, the cap film 13 is removed from above the gate electrode 5 by wet etching using dilute hydrofluoric acid. Note that a silicon layer or a silicon germanium may be subjected to selective epitaxial growth on the deep source/drain diffusion layer 10 before removing the cap layer 13 from above the gate electrode 5. Thereby, the deep source/drain diffusion layer 10 is made to be a so-called raised source/drain diffusion layer, which reduces a junction leakage current of the source/drain diffusion layer 10 to thereby reduce the contact resistance.

Then, as in the first embodiment, carrying out nickel silicidation causes nickel silicide layers 11, 11' to be formed on the gate electrode 5 and the deep source/drain diffusion layer 10.

Also in manufacturing procedures of this embodiment, a silicon dioxide film as the cap film 13 is formed on the gate electrode 5 before forming the deep source/drain diffusion layer 10 by arsenic ion-implantation. Therefore, it is possible to suppress arsenic ion-implantation into the gate electrode 5, which provides the same effect as the first embodiment.

Fourth Embodiment

Figure 14:
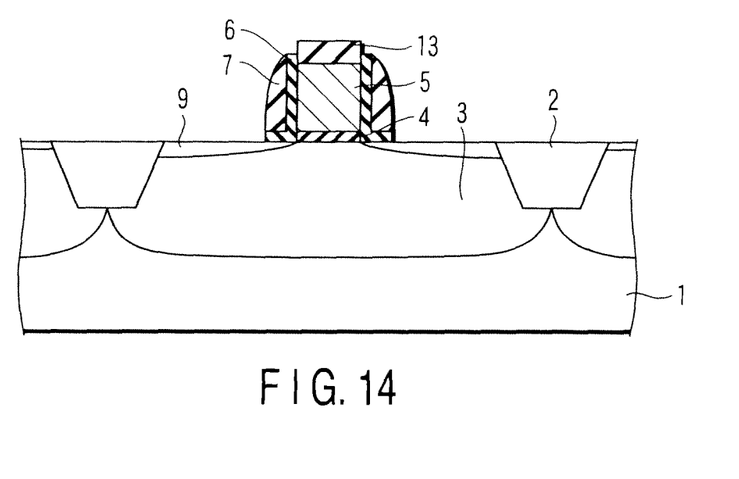
FIG. 14 is a sectional view of the semiconductor device according to a fourth embodiment of the invention, showing one of the processes of a method of manufacturing the semiconductor device.
Figure 15:
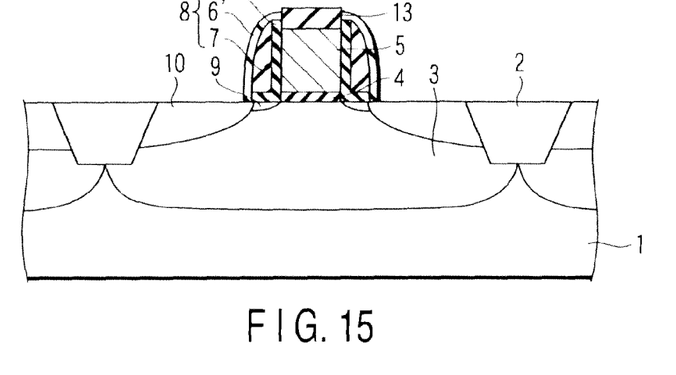
FIG. 15 is a sectional view of the semiconductor device according to the fourth embodiment of the invention, showing one of the processes of the method of manufacturing the semiconductor device, following the manufacturing process shown in FIG. 14.
Figure 16:
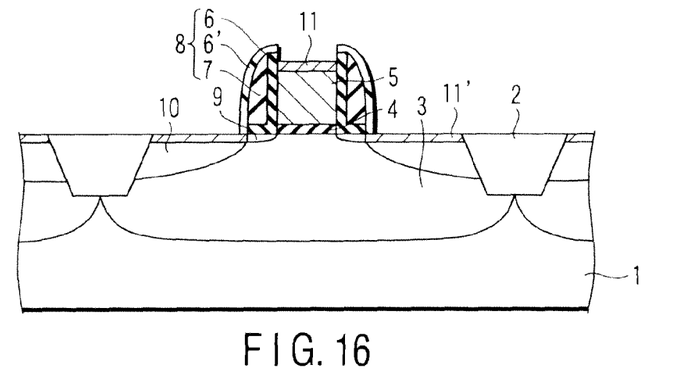
FIG. 16 is a sectional view of the semiconductor device according to the fourth embodiment of the invention, showing one of the processes of the method of manufacturing the semiconductor device, following the manufacturing process shown in FIG. 15.
Figure 17:
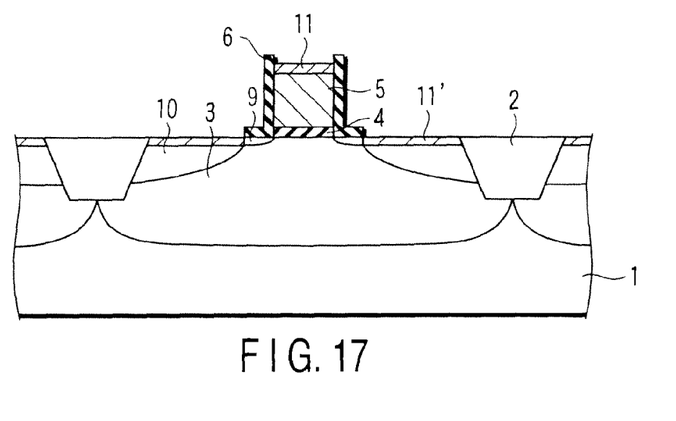
FIG. 17 is a sectional view of the semiconductor device according to the fourth embodiment of the invention, showing one of the processes of the method of manufacturing the semiconductor device, following the manufacturing process shown in FIG. 16.

FIGS. 14 to 17 are sectional views of a semiconductor device according to a fourth embodiment of the present invention, showing manufacturing processes of the semiconductor device. This embodiment is different from the first embodiment, as shown in FIG. 16, in that sidewall insulating films 8 on the both side surfaces of the gate electrode 5 are of a three-layer laminated structure type in which a silicon nitride film 6, a silicon dioxide film 7, and a silicon nitride film 6' are deposited on the both side surfaces of the gate electrode 5 in sequence. The silicon dioxide film 7 and the silicon nitride film 6' may not be provided. That is, the sidewall insulating layer 8 may be composed of only the silicon nitride film 6 formed on the side surfaces of the gate electrode 5, as shown in FIG. 17.

There will be detailed below manufacturing processes according to this embodiment.

Firstly, there is formed a device structure of FIG. 11 according to the third embodiment. Then, a silicon dioxide film 7 and a silicon nitride film 6 are deposited on the semiconductor substrate 1 by the use of a CVD method as shown in FIG. 14 in sequence. Next, the silicon nitride film 6 and the silicon dioxide film 7 are etched back by the use of an RIE method, thereby forming sidewalls of the gate electrode 5 composed of the silicon nitride film 6 and the silicon dioxide film 7 on the both side surfaces of the gate electrode 5.

As shown in FIG. 15, with gate electrode 5 and sidewalls of the gate electrode 5 as a mask, arsenic is ion-implanted provided that its accelerating voltage is 5 to 40 KeV and its dose amount 1.0E15 to 4.0E15 cm$^{-2}$, and simultaneously, phosphorus is ion-implanted, provided that its accelerating voltage 5 to 20 KeV and its dose amount is 1.0E15 to 4.0E15 cm$^{-2}$. Then, by activating the ion-implanted arsenic by the use of RTA, a deep source/drain diffusion layer 10 having a depth of 40 to 100 nm is formed. Since the deep source/drain diffusion layer 10 contains arsenic, the arsenic concentration characteristic curve represents a steep profile, thereby suppressing an interface resistance between nickel silicide and n+ silicon. Since the cap film 12 is formed on the gate electrode 5, the arsenic ion-implantation into the gate electrode 5 is suppressed when ion-implanting arsenic in this process.

Subsequently, a silicon nitride film 6' for covering the sidewall insulation film including the silicon nitride film 6 and the silicon dioxide film 7 is deposited on the semiconductor substrate 1, followed by etching back the deposited silicon nitride films 6', which causes sidewall film 6' for covering the silicon dioxide film 7 to be formed on the side walls of the gate electrode. A three-layer laminated structure of the silicon nitride films 6, 6' and the silicon dioxide film 7 forms a sidewall insulating film 8. The sidewall film 6' for covering the silicon dioxide film 7 may not be provided. The cap film 13 is removed from above the gate electrode 5 by wet etching using dilute hydrofluoric acid. Moreover, a silicon layer or a silicon germanium layer may be subjected to selective epitaxial growth on the deep source/drain diffusion layer 10 before removing the cap layer 13 from above the gate electrode 5. Thereby, the deep source/drain diffusion layer 10 is made to be a so-called raised source/drain diffusion layer, which reduces a junction leakage current of the source/drain diffusion layer 10 to thereby reduce the contact resistance.

Then, as in the first embodiment, carrying out nickel silicidation causes nickel silicide layers 11, 11' to be formed on the gate electrode 5 and the deep source/drain diffusion layer 10, as shown in FIG. 16. If the sidewall film 6' is not disposed, the silicon dioxide 7 is removed by etching, as shown in FIG. 17.

Also in manufacturing procedures of this embodiment, a silicon dioxide film as the cap film 13 is formed on the gate electrode 5 before forming the deep source/drain diffusion layer 10 by arsenic ion-implantation. Therefore, it is possible to suppress arsenic ion-implantation into the gate electrode 5, which provides the same effect as the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
a gate electrode having a laminated structure of a polycrystalline silicon film containing arsenic and phosphorous or a polycrystalline germanium film containing arsenic and phosphorous and a first silicide layer formed in sequence on an element forming region of a semiconductor substrate through a gate insulating film;
a sidewall insulating film formed on a side surface of the gate electrode;
source/drain layers containing arsenic formed in the element forming region at both side portions of the gate electrode; and
second silicide layers formed on the source/drain layers,
wherein a peak concentration of arsenic contained in the gate electrode is lower than a peak concentration of arsenic contained in the source/drain layers,
the peak concentration of arsenic contained in the gate electrode is more than 1E19 cm−3, and
the peak concentration of arsenic contained in the source/drain layers is more than 1E20 cm−3.

2. A semiconductor device according to claim 1, wherein the sidewall insulating film is made of at least one of a silicon dioxide film or a silicon nitride film.

3. A semiconductor device according to claim 2, wherein the peak concentration of arsenic contained in the source/drain layers is at least 1E21 cm$^{-3}$.

4. A semiconductor device according to claim 2, wherein the dose amount of phosphorus is 3.0 to 5.0 E15 cm$^{-2}$.

5. A semiconductor device according to claim 2, wherein the first silicide layer comprises nickel.

6. A semiconductor device according to claim 1, wherein the sidewall insulating film comprises a two-layer structure of a silicon nitride film and a silicon dioxide film which are formed on the side surface of the gate electrode in sequence.

7. A semiconductor device according to claim 6, wherein the first silicide layer comprises nickel.

8. A semiconductor device according to claim 1, wherein the sidewall insulating film comprises a three-layer structure of a silicon dioxide film, a silicon nitride film, and a silicon dioxide film which are formed on the side surface of the gate electrode in sequence.

9. A semiconductor device according to claim 8, wherein the first silicide layer comprises nickel.

10. A semiconductor device according to claim 1, wherein the sidewall insulating film comprises a two-layer structure of a silicon dioxide film and a silicon nitride film which are formed on the side surface of the gate electrode in sequence.

11. A semiconductor device according to claim 10, wherein the first silicide layer comprises nickel.

12. A semiconductor device according to claim 1, wherein the sidewall insulating film comprises a three-layer structure of a silicon nitride film, a silicon dioxide film, and a silicon nitride film which are formed on the side surface of the gate electrode in sequence.

13. A semiconductor device according to claim 12, wherein the first silicide layer comprises nickel.

14. A semiconductor device according to claim 1, wherein the source/drain layers comprise a first source/drain layer which is deep in depth and a second source/drain layer which is shallow in depth, respectively.

15. A semiconductor device according to claim 14, wherein an epitaxial growth layer is formed on the second source/drain layer.

16. A semiconductor device according to claim 14, wherein the first silicide layer comprises nickel.

17. A semiconductor device according to claim 1, wherein the peak concentration of arsenic contained in the source/drain layers is at least 1E21 cm$^{-3}$.

18. A semiconductor device according to claim 1, wherein the dose amount of phosphorus is 3.0 to 5.0 E15 cm$^{-2}$.

19. A semiconductor device according to claim 1, wherein the first silicide layer comprises nickel.

* * * * *